(12) United States Patent
Kim

(10) Patent No.: US 12,131,034 B2
(45) Date of Patent: Oct. 29, 2024

(54) STORAGE DEVICE DETERMINING WHETHER TO APPLY THERMAL THROTTLING MODE TO TARGET OPERATION

(71) Applicant: SK hynix Inc., Icheon (KR)

(72) Inventor: Chi Eun Kim, Icheon (KR)

(73) Assignee: SK hynix Inc., Icheon (KR)

( * ) Notice: Subject to any disclaimer, the term of this patent is extended or adjusted under 35 U.S.C. 154(b) by 28 days.

(21) Appl. No.: 18/146,880

(22) Filed: Dec. 27, 2022

(65) Prior Publication Data
US 2024/0078023 A1 Mar. 7, 2024

(30) Foreign Application Priority Data
Sep. 7, 2022 (KR) .................. 10-2022-0113329

(51) Int. Cl.
G06F 3/06 (2006.01)
(52) U.S. Cl.
CPC .......... G06F 3/0619 (2013.01); G06F 3/0653 (2013.01); G06F 3/0679 (2013.01)

(58) Field of Classification Search
CPC ..... G06F 3/0619; G06F 3/0653; G06F 3/0679
See application file for complete search history.

(56) References Cited

U.S. PATENT DOCUMENTS

| 2017/0177262 | A1 | 6/2017 | Sharma et al. | |
| 2017/0351427 | A1* | 12/2017 | Klein | G11C 16/10 |
| 2018/0046231 | A1* | 2/2018 | Raghu | G06F 1/3275 |
| 2019/0018474 | A1* | 1/2019 | Bacchus | G06F 1/3206 |

FOREIGN PATENT DOCUMENTS

KR   10-2021-0121686 A   10/2021

* cited by examiner

Primary Examiner — Gurtej Bansal

(57) ABSTRACT

A storage device and a method thereof determine a candidate memory block satisfying a set condition among a plurality of memory blocks when the temperature of a memory is equal to or higher than a first temperature as a target memory block. The target memory block is used to determine whether to apply a thermal throttling mode to a target operation to be executed on the memory when the temperature of the memory is equal or higher than a second temperature in order to avoid unnecessary thermal throttling.

15 Claims, 8 Drawing Sheets

STORAGE DEVICE DETERMINING WHETHER TO APPLY THERMAL THROTTLING MODE TO TARGET OPERATION

CROSS-REFERENCE TO RELATED APPLICATION

The present application claims priority under 35 U.S.C. § 119(a) to Korean Patent Application No. 10-2022-0113329 filed on Sep. 7, 2022, which is incorporated herein by reference in its entirety.

BACKGROUND

1. Technical Field

Various embodiments generally relate to a storage device which determines whether to apply a thermal throttling mode to a target operation and a method thereof.

2. Related Art

A storage device is a device which stores data on the basis of a request of a host such as a computer, a mobile terminal such as a smartphone or tablet, or various electronic devices.

The storage device may include a controller for controlling a memory (e.g., a volatile memory or ha nonvolatile memory). The controller may receive a command from the host, and may execute or control an operation for reading, writing or erasing data with respect to the memory included in the storage device, on the basis of the received command.

A plurality of memory blocks included in the memory may have different operating characteristics. In particular, the plurality of memory blocks may have different temperature distributions even while the same operation is executed.

SUMMARY

Various embodiments are directed to a storage device capable of preventing a thermal throttling mode from being unnecessarily applied to a target operation to be executed for a memory, and a method thereof.

In an embodiment, a storage device may include: i) a memory including a plurality of memory blocks; and ii) a controller configured to determine a candidate memory block accessed among the plurality of memory blocks when the temperature of the memory is equal to or higher than a first temperature, as a target memory block, and determine, using the target memory block, whether to apply a thermal throttling mode to a target operation to be executed on the memory when the temperature of the memory is equal or higher than a second temperature.

In an embodiment, a method for operating a storage device may include: i) measuring the temperature of a memory including a plurality of memory blocks; ii) monitoring the plurality of memory blocks when the temperature of the memory is equal to or higher than a first temperature; iii) determining a candidate memory block accessed among the plurality of memory blocks, as a target memory block; and iv) determining whether to apply a thermal throttling mode to a target operation to be executed on the memory when the temperature of the memory is equal to or higher than a second temperature, on the basis of the target memory block.

In an embodiment, a controller may include: i) a memory interface capable of communicating with a memory including a plurality of memory blocks; and ii) a control circuit configured to determine a candidate memory block which satisfies a set condition among the plurality of memory blocks when the temperature of the memory is equal to or higher than a first temperature, as a target memory block, and determine, using the target memory block, whether to apply a thermal throttling mode to a target operation to be executed on the memory when the temperature of the memory is equal or higher than a second temperature.

According to the embodiments of the disclosed technology, it is possible to prevent a thermal throttling mode from being unnecessarily applied to a target operation to be executed for a memory.

DETAILED DESCRIPTION

Figure 1:
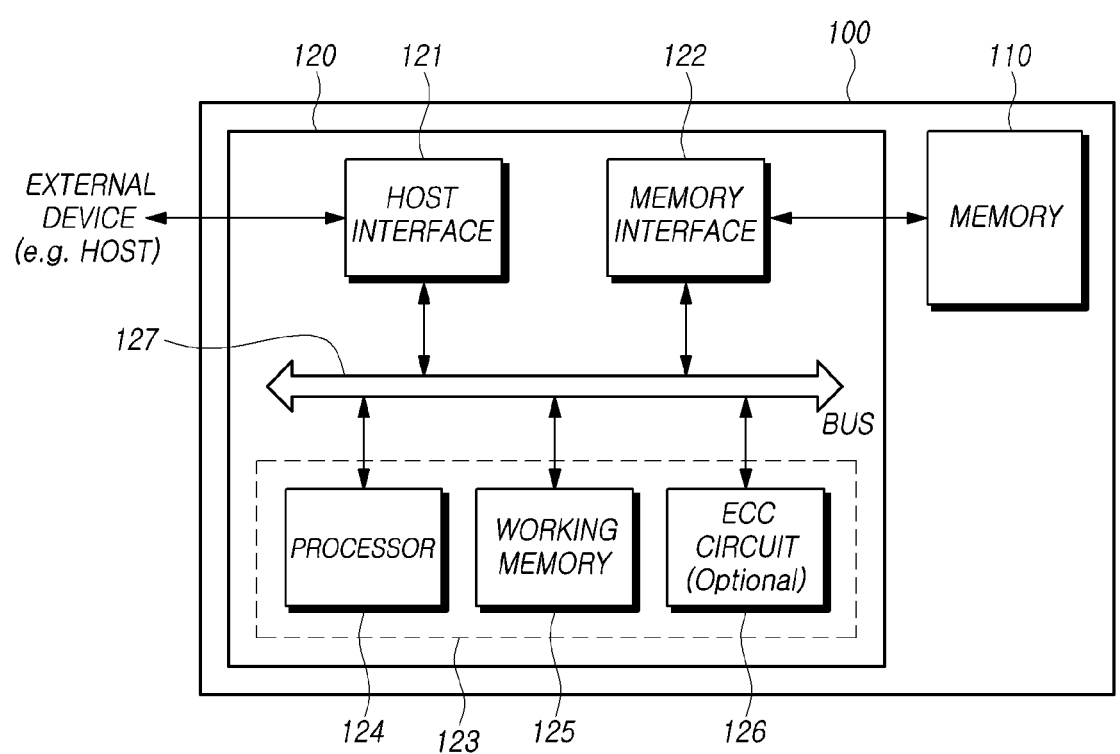
FIG. 1 is a schematic diagram of a storage device based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods disclosed herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

Hereinafter, embodiments of the present disclosure will be described in detail with reference to the accompanying drawings.

FIG. 1 is a schematic configuration diagram of a storage device 100 based on an embodiment of the disclosed technology.

Referring to FIG. 1, the storage device 100 based on the embodiment of the disclosed technology may include a memory 110 which stores data, and a controller 120 which controls the memory 110.

The memory 110 includes a plurality of memory blocks, and operates in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells") which store data. Such a memory cell array may exist in a memory block.

For example, the memory 110 may be realized by various types such as DDR SDRAM (double data rate synchronous dynamic random access memory), LPDDR4 (low power double data rate 4) SDRAM, GDDR (graphics double data rate) SDRAM, LPDDR (low power DDR), RDRAM (Rambus dynamic random access memory), NAND flash memory, 3D NAND flash memory, NOR flash memory, resistive random access memory (RRAM), phase-change memory (PRAM), magnetoresistive random access memory (MRAM), ferroelectric random access memory (FRAM) and spin transfer torque random access memory (STT-RAM).

The memory 110 may be implemented as a three-dimensional array structure. In embodiments of the disclosed technology applied to flash memory, the flash memory may be a flash memory in which a charge storage layer is configured by a conductive floating gate, or may be a charge trap flash (CTF) in which a charge storage layer is configured by a dielectric layer.

The memory 110 may receive a command and an address from the controller 120 and may access an area which is selected by the address in the memory cell array. In other words, the memory 110 may perform an operation indicated by the command, on the area selected by the address.

For example, the memory 110 may perform a program operation, a read operation and an erase operation. In this connection, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. Background operations may include a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. On the other hand, the controller 120 may control the operation of the memory 110 regardless of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, a mobility device (e.g., a vehicle, a robot or a drone) traveling on land or water or in air under human control or traveling autonomously, etc.

The host may include at least one operating system (OS). The operating system may generally manage and control the function and operation of the host, and may provide interoperability between the host and the storage device 100. The operating system may be classified into one of a general operating system and a mobile operating system depending on the mobility of the host.

The controller 120 and the host may be devices which are separated from each other. As the case may be, the controller 120 and the host may be implemented by being integrated into one device. Hereunder, for the sake of convenience in explanation, an example is described in which the controller 120 and the host are devices which are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface which uses at least one among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 in response to the control of the control circuit 123.

The control circuit 123 performs the general control operation of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method, and a hybrid mapping method.

The processor 124 may randomize data received from the host. For example, the processor 124 may randomize data received from the host, by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110, by using a derandomizing seed. The derandomized data may be outputted to the host.

The processor 124 may execute firmware to control the operation of the controller 120. Namely, in order to control the general operation of the controller 120 and perform a logic calculation, the processor 124 may execute firmware loaded in the working memory 125 upon booting. Hereafter, an operation of the storage device 100 to be described based on the embodiment of the disclosed technology may be implemented in such a way that the processor 124 executes firmware in which the corresponding operation is defined.

Firmware, as a program to be executed in the storage device 100 to perform operations of the storage device 100, may include various functional layers. For example, the firmware may include binary data in which codes for executing the functional layers, respectively, are defined.

For example, the firmware may include at least one among a flash translation layer (FTL) which performs a translating function between a logical address sent to the storage device 100 from the host and a physical address of the memory 110, a host interface layer (HIL) which serves to analyze a command sent to the storage device 100 from the host and transfer the command to the flash translation layer (FTL), and a flash interface layer (FIL) which transfers a command, produced by the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware in which a logic calculation to be performed is defined is not loaded in the working memory 125, the processor 124 may generate an event (e.g., an interrupt) for loading the corresponding part of the firmware in the working memory 125.

The processor 124 may load metadata necessary for driving firmware, from the memory 110. The metadata, as data for managing the memory 110, may include management information on user data stored in the memory 110.

Firmware may be updated while the storage device 100 is manufactured or while the storage device 100 is operating. The controller 120 may download new firmware from the outside of the storage device 100 and update existing firmware with the new firmware.

The working memory 125 may store firmware, a program code, a command and data which are necessary to perform operations of the controller 120. Such a working memory 125 as, for example, a volatile memory may include at least one among an SRAM (static RAM), a DRAM (dynamic RAM) and an SDRAM (synchronous DRAM).

The error detection and correction circuit 126 may detect an error bit in target data and correct the detected error bit by using an error correction code. The target data may be, for example, data stored in the working memory 125 or data read from the memory 110.

The error detection and correction circuit 126 may be configured to decode data by using an error correction code. The error detection and correction circuit 126 may be realized using various code decoders. For example, a decoder which performs unsystematic code decoding or a decoder which performs systematic code decoding may be used.

For example, the error detection and correction circuit 126 may detect an error bit by the unit of a set sector in each of read data. Namely, each read data may be constituted by a plurality of sectors. A sector may mean a data unit smaller than a page, where a page is the read unit of a flash memory. Sectors constituting each read data may be matched with one another by the medium of an address.

The error detection and correction circuit 126 may calculate a bit error rate (BER), and may determine whether an error is correctable or not, in the unit of sector. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 432 may determine that a corresponding sector is correctable or a pass.

The error detection and correction circuit 126 may sequentially perform an error detection and correction operation for all read data. In the case where a sector included in read data is correctable, the error detection and correction circuit 126 may omit an error detection and correction operation for a corresponding sector for the next read data. When the error detection and correction operations for all read data are completed in this way, the error detection and correction circuit 126 may detect a sector which is determined to be uncorrectable to the end. There may be one or more sectors that are determined to be uncorrectable. The error detection and correction circuit 126 may transfer information (for example, address information) on a sector determined to be uncorrectable to the processor 124.

A bus 127 may be configured to provide channels among the components 121, 122, 124, 125 and 126 of the controller 120. The bus 127 may include, for example, a control bus for transferring various control signals, commands and the likes, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. As the case may be, in addition to the above-described components 121, 122, 124, 125 and 126 of the controller 120, one or more other components may be added.

Hereinbelow, the memory 110 will be described in further detail with reference to FIG. 2.

Figure 2:
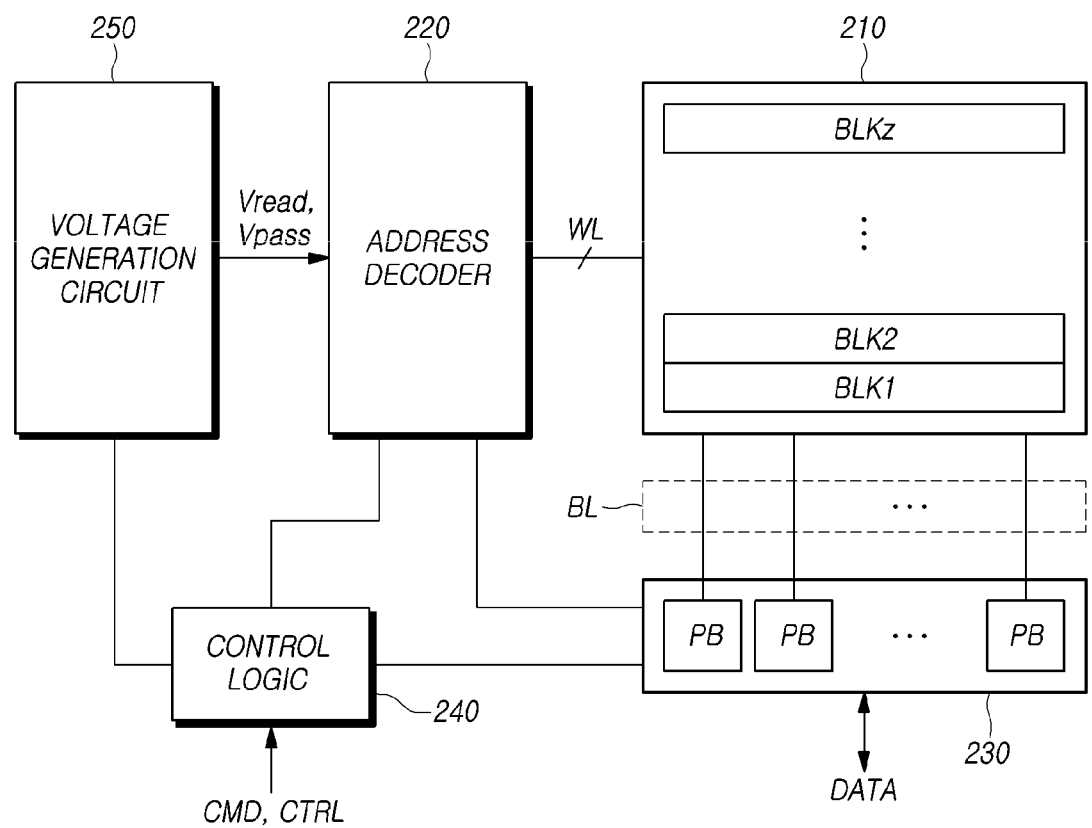
FIG. 2 is a block diagram schematically illustrating a memory of FIG. 1.

FIG. 2 is a diagram schematically illustrating the memory 110 of FIG. 1.

Referring to FIG. 2, the memory 110 based on an embodiment of the disclosed technology may include a memory cell array 210, an address decoder 220, a read and write circuit 230, a control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells which have vertical channel structures.

The memory cell array 210 may be configured by a memory cell array of a two-dimensional structure, or as the case may be, may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) which stores 1-bit data. For another instance, each of the plurality of memory cells included in the memory cell array 210 may be a multi-level cell (MLC) which stores 2-bit data. For still another instance, each of the plurality of memory cells included in the memory cell array 210 may be a triple level cell (TLC) which stores 3-bit data. For yet another instance, each of the plurality of memory cells included in the memory cell array 210 may be a quad level cell (QLC) which stores 4-bit data. For still yet another instance, the memory cell array 210 may include a plurality of memory cells, each of which stores or more-bit data.

The number of bits of data stored in each of the plurality of memory cells may be dynamically determined. For example, a single-level cell which stores 1-bit data may be changed to a triple-level cell which stores 3-bit data.

Referring to FIG. 2, the address decoder 220, the read and write circuit 230, the control logic 240 and the voltage generation circuit 250 may operate as a peripheral circuit which drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed in units of a page. An address received when a read operation or a program operation is requested may include at least one among a block address, a row address, and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which take charge of a data processing function, and as the case may be, may further include cache buffers which take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. As an exemplary embodiment, the read and write circuit 230 may include a column select circuit and so forth in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured as a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

A memory cell which is coupled to one of the plurality of word lines WL and one of the plurality of bit lines BL may be defined. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate which is surrounded by a dielectric and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

As the case may be, at least one dummy word line may be additionally disposed between the first outermost word line and the first select line. At least one dummy word line may also be additionally disposed between the second outermost word line and the second select line.

A read operation and a program operation (write operation) of the memory block described above may be performed in units of a page, and an erase operation may be performed in units of a memory block.

Figure 3:
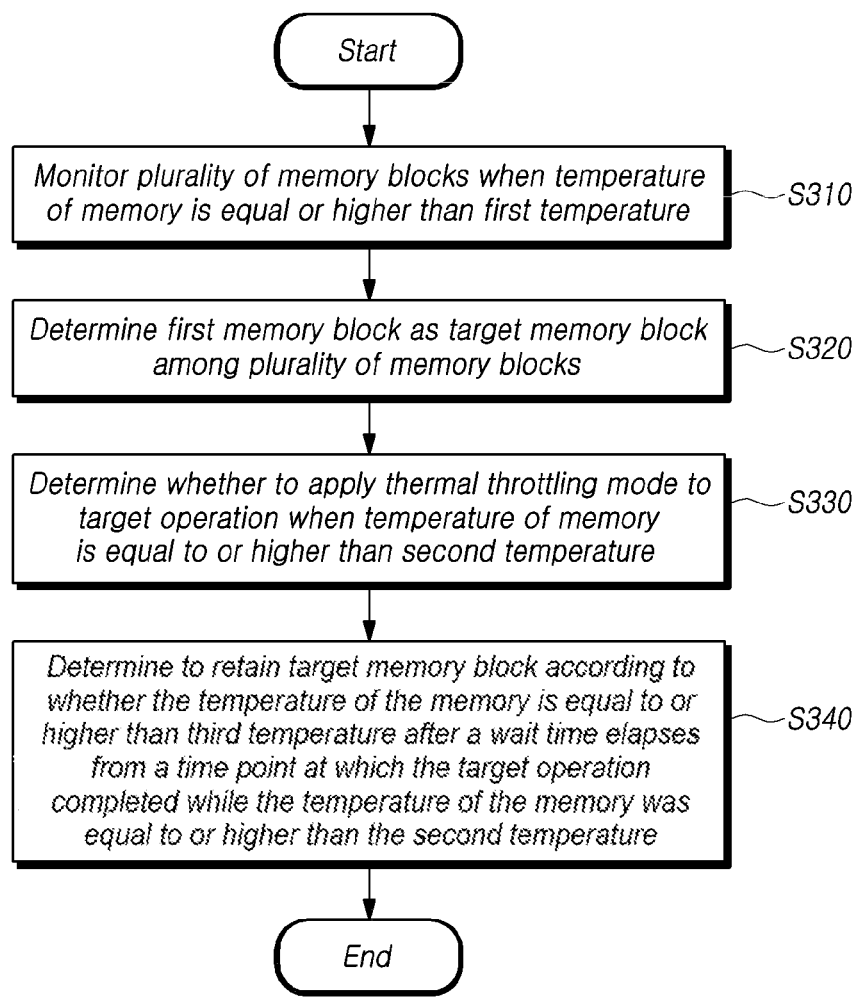
FIG. 3 is a flowchart illustrating a schematic operation of the storage device based on the embodiment of the disclosed technology.

FIG. 3 is a flowchart illustrating a schematic operation of the storage device 100 based on the embodiment of the disclosed technology.

Referring to FIG. 3, the controller 120 of the storage device 100 may monitor a plurality of memory blocks included in the memory 110, when the temperature of the memory 110 is equal to or higher than a first temperature (S310).

To monitor the plurality of memory blocks, the controller 120 checks whether an operation (e.g., a read operation, a write operation, or an erase operation) accessing the plurality of memory blocks is executed.

The controller 120 may collect information on the temperature of the memory 110 from a temperature sensor (not illustrated) included in the storage device 100, and may determine, on the basis of the collected information, whether the temperature of the memory 110 is equal to or higher than the first temperature.

The controller 120 may determine a first block, which is a candidate memory block which satisfies a set condition among the plurality of monitored memory blocks, as a target memory block (S320). The controller 120 may add information that the candidate memory block is a target memory block to metadata stored in the memory 110.

The controller 120 may determine whether to apply a thermal throttling mode to a target operation (e.g., a read operation, a write operation, or an erase operation) to be executed for the memory 110 when the temperature of the memory 110 is equal to or higher than a second temperature (S330).

Temperature distributions during operation of the plurality of memory blocks may be different from each other. For example, a candidate memory block among the plurality of memory blocks may operate at a higher temperature than other memory blocks. The candidate memory block may be a normal memory block which does not cause an uncorrectable ECC (UECC) or a program status fail (PSF) as a bad memory block would, but may unnecessarily increase the temperature of the memory 110.

Applying the thermal throttling mode to a target operation means that the target operation is processed at a slower speed than when the thermal throttling mode is not applied to the target operation. This is to prevent a problem in which the memory 110 malfunctions due to an abrupt rise in the temperature of the memory 110 in the process of performing the target operation.

For example, the target operation may be a read, write, or erase operation requested from the outside (e.g., from the host) of the storage device 100. For another example, the target operation may be a background operation (e.g., a garbage collection (GC) operation, a wear leveling (WL) operation, a read reclaim (RR) operation or a bad block management (BBM) operation).

In some embodiments, whether to retain the candidate memory block as the target memory block may be determined according to whether the temperature of the memory 110 is equal to or higher than a third temperature after a wait time elapses from a time point at which the target operation completed while the temperature of the memory 110 was equal to or higher than the second temperature (S340). When the temperature of the memory 110 after the wait time is equal to or higher than the third temperature, the controller 120 may release the candidate memory block from the target memory block. On the other hand, when the temperature of the memory 110 after the wait time is lower than the third temperature, the controller 120 may retain the candidate memory block as the target memory block. The step S340 may be optionally performed after the above-described steps S310 to S330 are performed.

Figure 4:
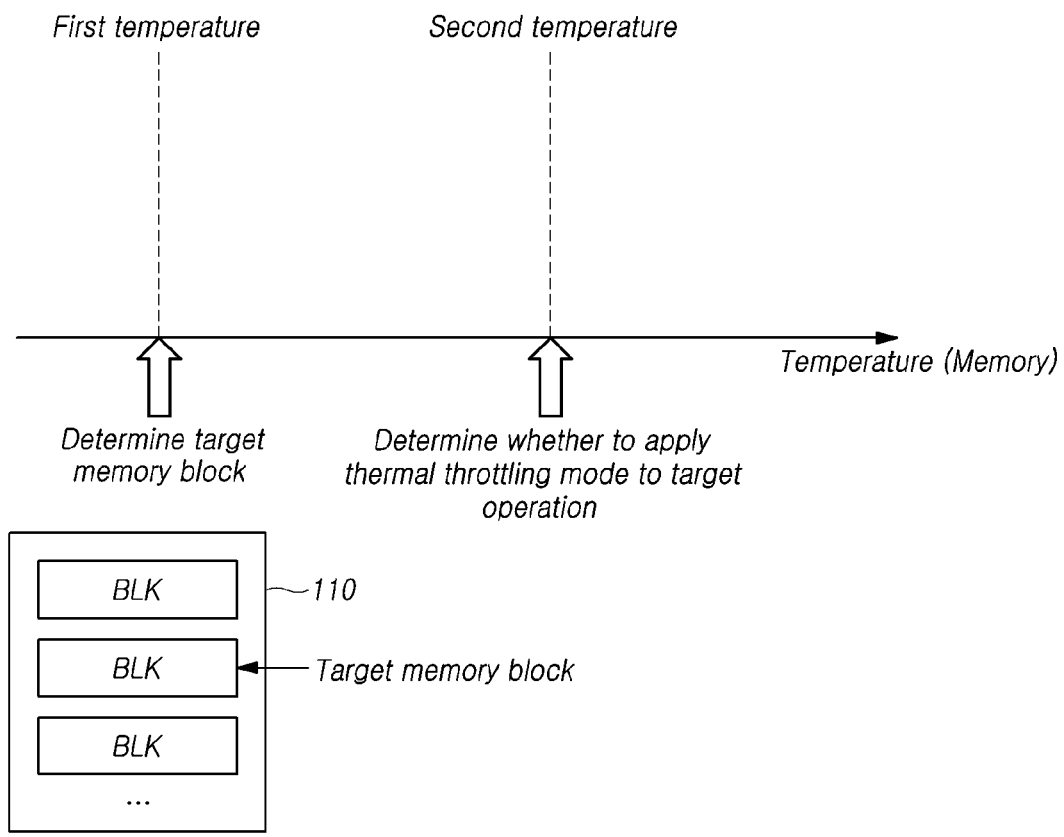
FIG. 4 illustrates an example of an operation of the storage device based on the embodiment of the disclosed technology.

FIG. 4 illustrates an example of an operation of the storage device 100 based on the embodiment of the disclosed technology.

Referring to FIG. 4, the controller 120 of the storage device 100 may determine a target memory block among the plurality of memory blocks included in the memory 110 when the temperature of the memory 110 is equal to or higher than the first temperature. As described above with reference to FIG. 3, the target memory block may be a memory block among the plurality of memory blocks BLK that satisfies the set condition.

The controller 120 may determine whether to apply the thermal throttling mode to a target operation when the temperature of the memory 110 is equal to or higher than the second temperature. As described above with reference to FIG. 3, the controller 120 may determine whether to apply the thermal throttling mode to the target operation on the basis of the target memory block.

Figure 5:
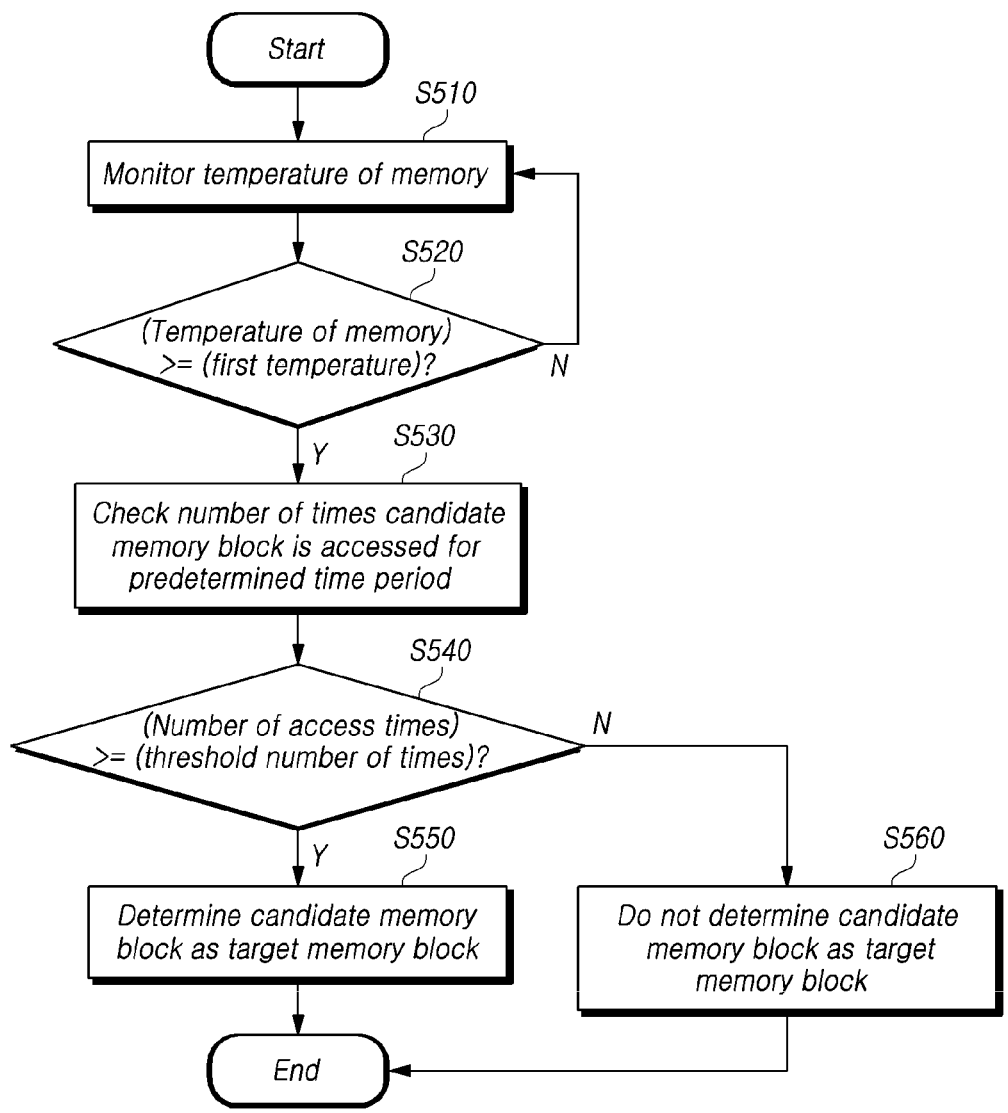
FIG. 5 is a flowchart illustrating an example of determining a target memory block by the storage device based on the embodiment of the disclosed technology.

FIG. 5 is a flowchart illustrating an example of determining a target memory block as may be done by the storage device 100 based on the embodiment of the disclosed technology.

Referring to FIG. 5, first, the controller 120 of the storage device 100 may monitor the temperature of the memory 110 (S510).

The controller 120 determines whether the temperature of the memory 110 is equal to or higher than the first temperature (S520). When the temperature of the memory 110 is lower than the first temperature (S520—N), the controller 120 may enter the step S510 again.

When the temperature of the memory 110 is equal to or higher than the first temperature (S520—Y), the controller 120 may check the number of times a candidate memory block is accessed during a predetermined time period (S530). The number of times the candidate memory block is accessed may be defined as the number of times read, write, or erase operations are executed on the candidate memory block.

The controller 120 determines whether the number of times the candidate memory block is accessed is equal to or greater than a set threshold number of times (S540).

When the number of times the candidate memory block is accessed is equal to or greater than the threshold number of times (S540—Y), the controller 120 may determine the candidate memory block as a target memory block (S550). That is to say, when the temperature of the memory 110 rises to be equal to or higher than the first temperature, the controller 120 may determine a memory block with a high access frequency as a target memory block.

On the other hand, when the number of times the candidate memory block is accessed is less than the threshold number of times (S540—N), the controller 120 does not determine the candidate memory block as a target memory block (S560).

Figure 6:
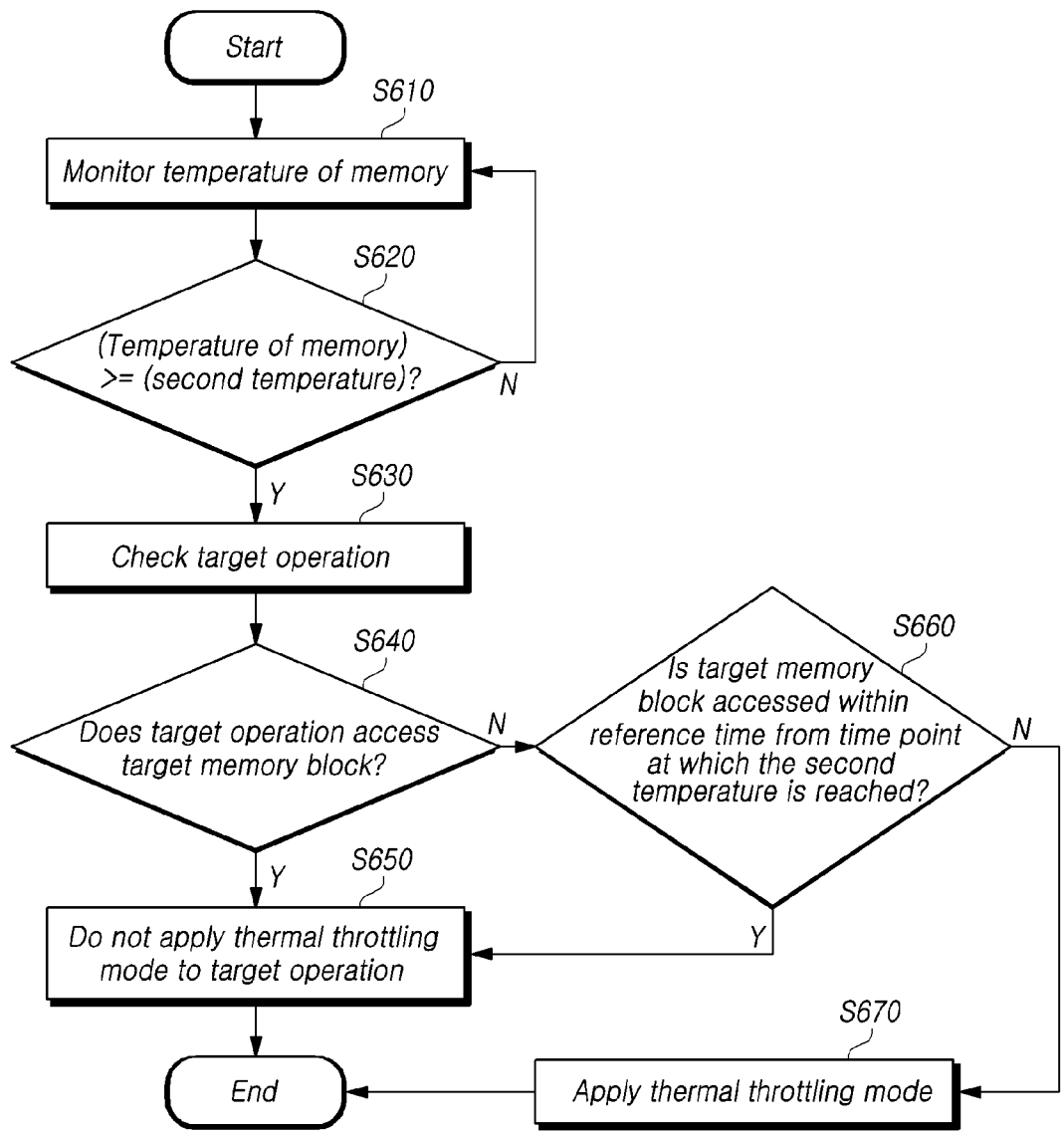
FIG. 6 is a flowchart illustrating an example of determining whether to apply a thermal throttling mode to a target operation, by the storage device based on the embodiment of the disclosed technology.

FIG. 6 is a flowchart illustrating an example of determining whether to apply a thermal throttling mode to a target operation as may be done by the storage device 100 based on the embodiment of the disclosed technology.

Referring to FIG. 6, first, the controller 120 of the storage device 100 may monitor the temperature of the memory 110 (S610).

The controller 120 determines whether the temperature of the memory 110 is equal to or higher than the second temperature (S620). When the temperature of the memory 110 is lower than the second temperature (S620—N), the controller 120 may enter the step S610 again.

When the temperature of the memory 110 is equal to or higher than the second temperature (S620—Y), the controller 120 may check a target operation to be executed on the memory 110 (S630).

The controller 120 determines whether the target operation accesses a target memory block determined as described above (S640).

When the target operation accesses the target memory block (S640—Y), the controller 120 does not apply the thermal throttling mode to the target operation (S650). In other words, the target operation may be normally processed.

On the other hand, when the target operation does not access the target memory block (S640—N), the controller 120 determines whether the target memory block has been accessed within a set reference time from a time point at which the temperature of the memory 110 reached the second temperature (S660).

When the target memory block was accessed within the reference time (S660—Y), the controller 120 does not apply the thermal throttling mode to the target operation (S650).

On the other hand, when the target memory block is not accessed within the reference time (S660—N), the controller 120 applies the thermal throttling mode to the target operation (S670).

When the target operation accesses the target memory block or the target memory block is accessed within the set reference time from a time point at which the temperature of the memory 110 reaches the second temperature, the controller 120 may determine that the reason why the temperature of the memory 110 has risen to be equal to or higher than the second temperature is because the target memory block was accessed.

As described above, the target memory block may operate normally at a higher temperature than other memory blocks. Accordingly, the controller 120 may determine that it is normal for the temperature of the memory 110 to increase due to the target memory block. In this case, the controller 120 may not apply the thermal throttling mode to the target operation in order to prevent performance degradation caused by unnecessarily applying the thermal throttling mode.

Figure 7:
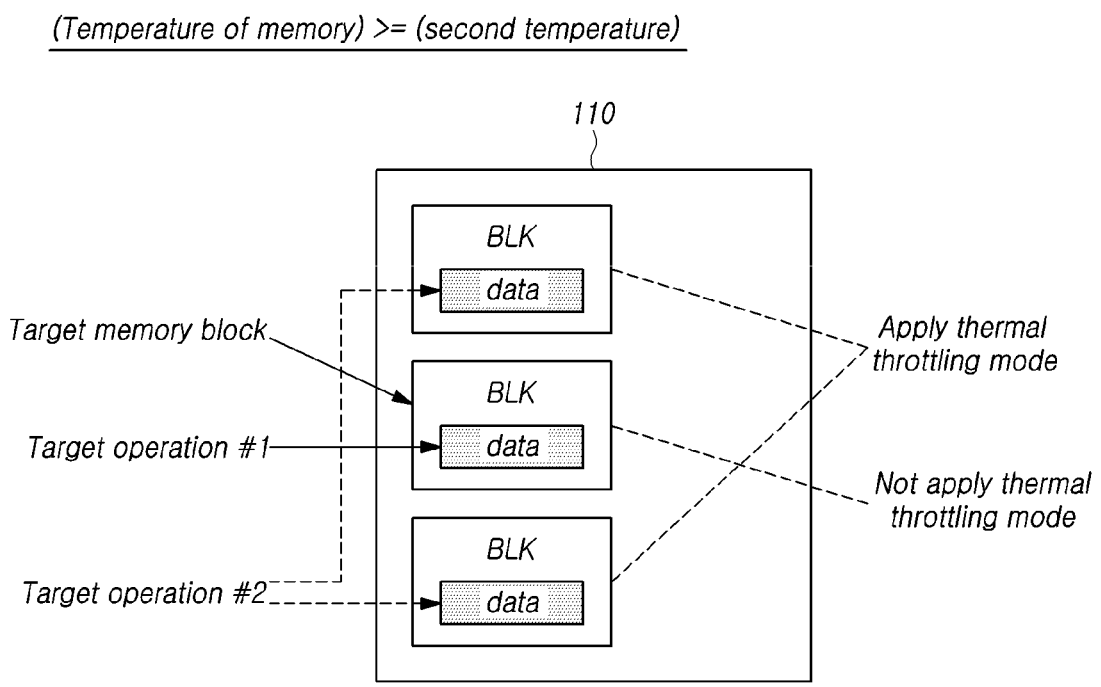
FIG. 7 illustrates an example of applying a thermal throttling mode to a target operation by the storage device based on the embodiment of the disclosed technology.

FIG. 7 is a diagram illustrating an example of applying a thermal throttling mode to a target operation by the storage device 100 based on the embodiment of the disclosed technology.

Referring to FIG. 7, the storage device 100 may determine whether to apply the thermal throttling mode differently for the plurality of memory blocks BLK included in the memory 110, depending on the target operation, when the temperature of the memory 110 is equal to or higher than the second temperature.

In FIG. 7, the controller 120 may not apply the thermal throttling mode to a target operation #1 that accesses a target memory block among the plurality of memory blocks BLK.

On the other hand, the controller 120 may apply the thermal throttling mode to target operations #2 that access the memory blocks other than the target memory block among the plurality of memory blocks BLK.

Figure 8:
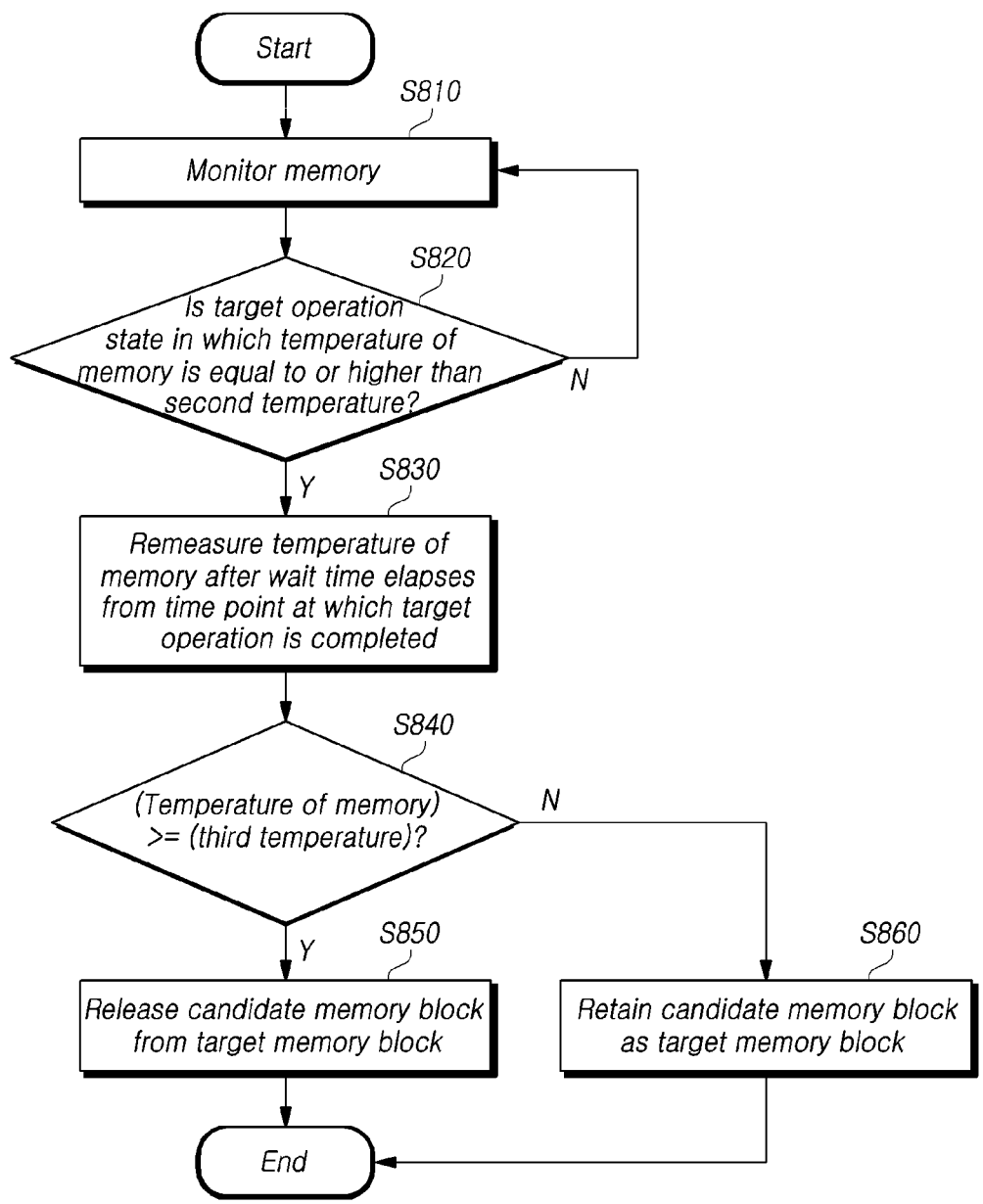
FIG. 8 is a flowchart illustrating an example of determining whether to retain a target memory block, by the storage device based on the embodiment of the disclosed technology.

FIG. 8 is a flowchart illustrating an example of determining whether to retain a target memory block as may be done by the storage device 100 based on the embodiment of the disclosed technology.

Referring to FIG. 8, the controller 120 of the storage device 100 may monitor the memory 110 (S810).

The controller 120 determines whether the target operation for the memory 110 is completed in a state in which the temperature of the memory 110 is equal to or higher than the second temperature (S820). If the target operation is not completed (S820—N), the controller 120 may enter the step S810 again.

When the target operation is completed (S820—Y), the controller 120 may remeasure the temperature of the memory 110 after a set wait time elapses from a time point at which the target operation is completed (S830).

The controller 120 determines whether the temperature of the memory 110 remeasured after the wait time elapses is equal to or higher than a third temperature (S840). In embodiments, the third temperature may be higher than the first temperature and lower than the second temperature. In other embodiments, the third temperature may be the same as the second temperature.

When the temperature of the memory 110 is equal to or higher than the third temperature (S840—Y), the controller 120 may release the candidate memory block currently designated as the target memory block from being the target memory block (S850).

On the other hand, when the temperature of the memory 110 is lower than the third temperature (S840—N), the controller 120 may retain the candidate memory block as the target memory block (S860).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A storage device comprising:
   a memory including a plurality of memory blocks; and
   a controller configured to:
   determine a candidate memory block, accessed among the plurality of memory blocks when the temperature of the memory is equal to or higher than a first temperature, as a target memory block based on a number of times the candidate memory block is accessed in a state in which the temperature of the memory is equal to or higher than the first temperature, and
   determine, using the target memory block, whether to apply a thermal throttling mode to a target operation to be executed on the memory when the temperature of the memory is equal or higher than a second temperature.

2. The storage device according to claim 1, wherein the controller determines the candidate memory block as the target memory block when the number of times the candidate memory block is accessed during a predetermined time period in a state in which the temperature of the memory is equal to or higher than the first temperature is equal to or greater than a set threshold number of times.

3. The storage device according to claim 1, wherein the second temperature is higher than the first temperature.

4. The storage device according to claim 1, wherein the controller does not apply the thermal throttling mode to the target operation when the target operation accesses the target memory block when the temperature of the memory is equal to or higher than the second temperature.

5. The storage device according to claim 1, wherein the controller does not apply the thermal throttling mode to the target operation when the temperature of the memory is equal to or higher than the second temperature when the target memory block was accessed within a set reference time from a time point at which the temperature of the memory reached the second temperature.

6. The storage device according to claim 1, wherein the controller remeasures the temperature of the memory after a set wait time elapses from a time point at which the target operation was completed in a state in which the temperature of the memory was equal to or higher than the second temperature.

7. The storage device according to claim 6, wherein the controller releases the candidate memory block from the target memory block when the remeasured temperature of the memory is equal to or higher than a third temperature.

8. The storage device according to claim 7, wherein the third temperature is higher than the first temperature and lower than the second temperature.

9. A method for operating a storage device, comprising:
   measuring the temperature of a memory including a plurality of memory blocks;
   monitoring the plurality of memory blocks when the temperature of the memory is equal to or higher than a first temperature;
   determining a candidate memory block, accessed among the plurality of memory blocks, as a target memory block based on a number of times the candidate memory block is accessed in a state in which the temperature of the memory is equal to or higher than the first temperature; and
   determining whether to apply a thermal throttling mode to a target operation to be executed on the memory when the temperature of the memory is equal to or higher than a second temperature on the basis of the target memory block.

10. The method according to claim 9, wherein the candidate memory block is determined as the target memory block when the number of times the candidate memory block is accessed during a predetermined time period in a state in which the temperature of the memory is equal to or higher than the first temperature is equal to or greater than a set threshold number of times.

11. The method according to claim 9, wherein the second temperature is higher than the first temperature.

12. The method according to claim 9, wherein determining whether to apply the thermal throttling mode to the target operation includes determining not to apply the thermal throttling mode to the target operation when the target operation accesses the target memory block when the temperature of the memory is equal to or higher than the second temperature or the target memory block was accessed within a set reference time from a time point at which the temperature of the memory reached the second temperature.

13. The method according to claim 9, further comprising:
   waiting for a set wait time from a time point at which the target operation was completed in a state in which the temperature of the memory was equal to or higher than the second temperature; and
   remeasuring the temperature of the memory after the wait time elapses.

14. The method according to claim 13, further comprising:
   releasing the candidate memory block from the target memory block when the temperature of the memory remeasured after the wait time elapses is equal to or higher than a third temperature.

15. A controller comprising:
   a memory interface capable of communicating with a memory including a plurality of memory blocks; and
   a control circuit configured to:
   determine a candidate memory block, which satisfies a set condition among the plurality of memory blocks when the temperature of the memory is equal to or higher than a first temperature, as a target memory block based on a number of times the candidate memory block is accessed in a state in which the temperature of the memory is equal to or higher than the first temperature, and
   determine, using the target memory block, whether to apply a thermal throttling mode to a target operation to be executed on the memory when the temperature of the memory is equal or higher than a second temperature.

\* \* \* \* \*